UNITED STATES PATENT OFFICE.

BERNARD LAUTH, OF HOWARD, ASSIGNOR, BY MESNE ASSIGNMENTS, TO BENJAMIN F. JONES AND JAMES LAUGHLIN, OF PITTSBURG, PA.

IMPROVEMENT IN THE MANUFACTURE OF IRON.

Specification forming part of Letters Patent No. 25,235, dated August 23, 1859; extended seven years; reissue No. 7,003, dated March 21, 1876; application filed March 15, 1876.

*To all whom it may concern:*

Be it known that I, BERNARD LAUTH, formerly of Pittsburg, in the State of Pennsylvania, now of Howard, in the county of Centre and State of Pennsylvania, have invented a new and useful Improved Manufacture of Cold-Rolled Iron or Steel, embracing the process and product; and I do hereby declare the following to be a full, clear, and exact description thereof.

To enable others skilled in the art of rolling iron and steel to practice my invention, I will proceed to describe the process or method of applying it in practice, and the results attained thereby.

The nature of my invention consists in subjecting bars, plates, or sheets of wrought iron and steel, of any shape susceptible of being drawn through rolls, to a finishing process of "cold-rolling," whereby they are somewhat reduced in diameter, and at the same time their stiffness and strength is increased, without injury to the fiber of the metal, and in the product of cold rolled iron or steel resulting therefrom.

By the term "cold-rolling," as applied to my process, I do not mean to be understood that the pieces of iron or steel must be entirely cold, or of the same temperature as the atmosphere. I prefer that they should be cold, or practically so; but this is not necessary, as it may be found economical to commence the process of cold-rolling while the bars, plates, or sheets of iron or steel have such degree of artificial heat as they retain after they have been rolled out and shaped in the common way, and, if the heat be not too great, the same result of reducing and packing the fiber by the pressure of the rolls will ensue, whereby the requisite strength and stiffness due to my process are obtained.

In carrying out my process I take bars, plates, or sheets of iron or steel after they have been rolled out or shaped in the ordinary way, and pass them through a pair of rolls, of ordinary construction, which are plain or grooved, according to the shape of the piece of iron or steel under treatment, the rolling being continued until the desired reduction of size and increase of stiffness and strength are obtained.

The rolls may be of ordinary construction, chilled rolls being preferred, and should be of sufficient strength to withstand the requisite pressure. As a rule, a greater strength of rolls and greater degree of pressure are desirable in the process of cold-rolling than are required in the ordinary rolling of iron and steel; and I find that the better the quality of the iron the more pressure can be applied to it when subjected to my process.

I consider it preferable to have the iron or steel cold, or practically cold, although, if preferred, they may be cold-rolled while yet retaining artificial heat, as above stated.

In order that my process may be better understood, I will describe the result attained by its use by reference to an experiment which I made with two bars of the same quality of iron, one of which had been cold-rolled and the other had not. I placed a piece of round iron seven-eighths inch in diameter and five feet long, which had been rolled in the ordinary way, on two supports, one at each end of the bar, and at an elevation of two and one-half feet from the ground. Then on applying weight to the center of the bar I found that three hundred and fifty pounds were sufficient to bend the bar until the weight touched the ground. The bar was deflected about ten inches from a right line, and on removing the weight the bar retained its bent form. I then took another bar, made from the same kind of iron, and originally of the same size, but which had been subjected to my process of cold-rolling until the diameter was reduced nearly one-sixteenth of an inch, and put it to the same test. It now required five hundred and forty pounds of weight to bend the bar until the weight touched the ground, and when the weight was removed the bar sprung back very nearly to a right line, thus demonstrating that the lateral strength of the bar was increased by the cold-rolling more than fifty per cent.

It is probable that the process of cold-rolling as applied to steel may not produce as marked a change in the quality of that article as it does when applied to wrought-iron, owing to the more compact nature of steel. It is, however, extremely valuable in the treatment of wrought-iron, which, after being cold-rolled, and by reason of that process, has more the character of steel than of iron in density and hardness, so that for many purposes it can be advantageously used as a substitute for steel.

I am aware that in the process of covering one metal with another, as in the manufacture of tin plate and galvanized iron, the sheets or plates have been passed in a cold state through rollers. This, however, has not been, previously to my invention, practiced in such a manner as to produce the effect of cold-rolling in packing the fiber of the metal, and communicating the qualities of increased hardness, stiffness, and strength, which are characteristic of the product of my improved process.

Having thus described my improvement, what I claim as my invention, and desire to secure by Letters Patent, is—

1. The process of cold-rolling iron or steel, substantially as described, whereby its hardness, strength, and stiffness are increased.

2. As a new article of manufacture, sheets, plates, or bars of iron or steel, hardened, strengthened, and stiffened by cold-rolling, substantially as hereinbefore described.

In witness whereof I, the said BERNARD LAUTH, have hereunto set my hand.

BERNARD LAUTH.

Witnesses:
GEO. H. WISTAR,
WM. N. TAYLOR.